United States Patent
Gehrke

(10) Patent No.: US 10,644,201 B2
(45) Date of Patent: May 5, 2020

(54) OPTOELECTRONIC SEMICONDUCTOR CHIP

(71) Applicant: OSRAM Opto Semiconductors GmbH, Regensburg (DE)

(72) Inventor: Kai Gehrke, Oldenburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/741,860

(22) PCT Filed: Jul. 13, 2016

(86) PCT No.: PCT/EP2016/066659
§ 371 (c)(1),
(2) Date: Jan. 4, 2018

(87) PCT Pub. No.: WO2017/009377
PCT Pub. Date: Jan. 19, 2017

(65) Prior Publication Data
US 2018/0198028 A1  Jul. 12, 2018

(30) Foreign Application Priority Data

Jul. 13, 2015 (DE) .......... 10 2015 111 301

(51) Int. Cl.
*H01L 33/38* (2010.01)
*H01L 33/42* (2010.01)
(Continued)

(52) U.S. Cl.
CPC .............. *H01L 33/38* (2013.01); *H01L 33/32* (2013.01); *H01L 33/387* (2013.01); *H01L 33/42* (2013.01); *H01L 33/44* (2013.01); *H01L 33/62* (2013.01)

(58) Field of Classification Search
CPC ....... H01L 33/32; H01L 33/38; H01L 33/387; H01L 33/42; H01L 33/44; H01L 33/62
See application file for complete search history.

(56) References Cited

U.S. PATENT DOCUMENTS 9,190,572 B2 * 11/2015 Yin .................. H01L 33/38
2008/0185606 A1  8/2008 Sano et al.
(Continued)

FOREIGN PATENT DOCUMENTS

CN      1147009 C     4/2004
CN    101237013 A     8/2008
(Continued)

OTHER PUBLICATIONS

Second Office Action dated Jun. 20, 2019 in Chinese Application No. 201680041209.X.
(Continued)

*Primary Examiner* — Andrew Q Tran
(74) *Attorney, Agent, or Firm* — McDermott Will & Emery LLP

(57) ABSTRACT

In one embodiment, the optoelectronic semiconductor chip (1) comprises a first semiconductor region (21) of a first conductivity type and a second semiconductor region (23) of a second conductivity type. An active zone (22) configured for generating light is situated between these two semiconductor regions (21, 23). A first electric contact layer (31) is situated directly at the first semiconductor region (21) in places. Furthermore, a second electric contact layer (32) is situated directly at the second semiconductor region (23) in places, wherein the semiconductor regions (21, 23) are energized by way of the contact layers (31, 33). Furthermore, two metallic current leads (41, 43) and an insulation layer (5) are present. The insulation layer (5) covers the second semiconductor region (23) directly in places and rises over the latter. Further, the insulation layer (5) is (Continued)

Figure 1:
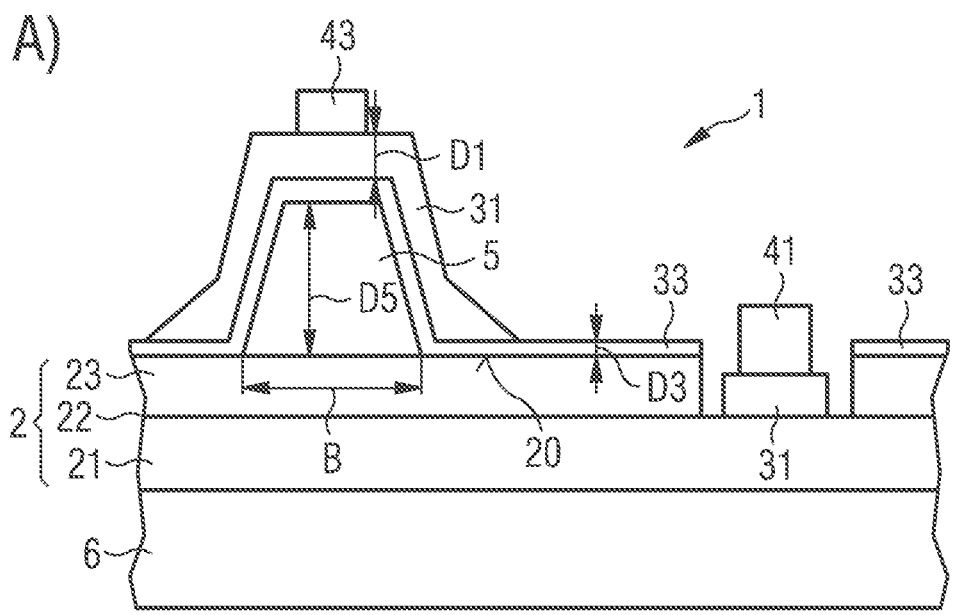
Figure 1:
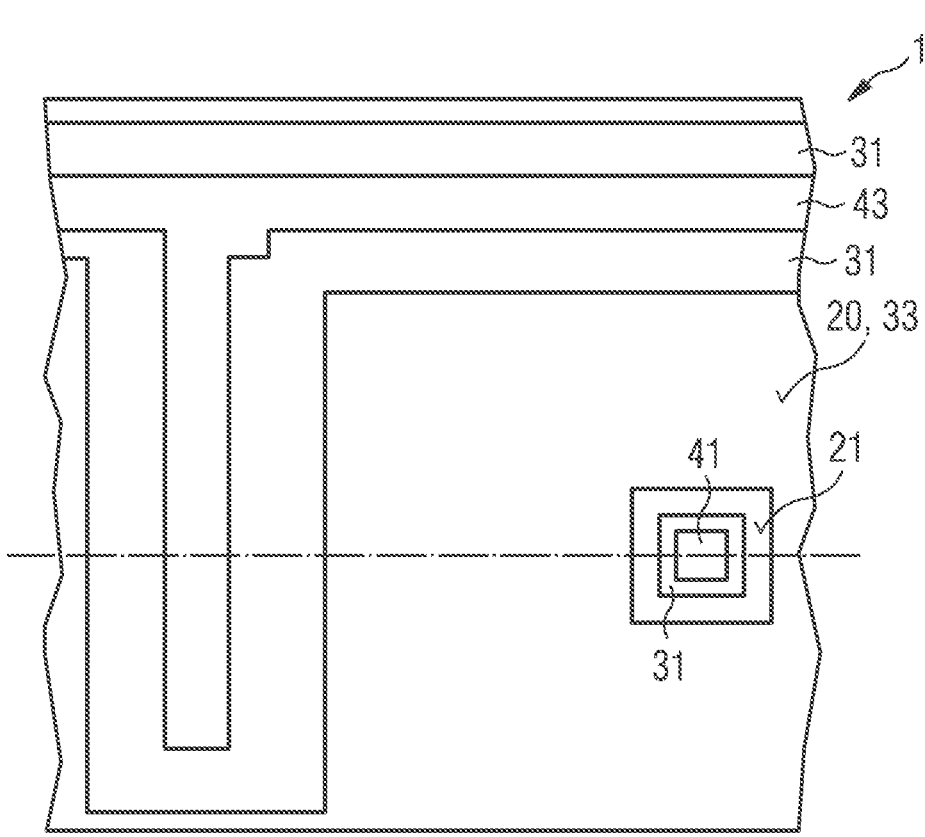

situated below the current lead (43) for the second semiconductor region (23). Both contact layers (31, 33) are produced from a transparent conductive oxide and the first contact layer (31) is formed directly over the second contact layer (33) and also over the insulation layer (5).

14 Claims, 2 Drawing Sheets

(51) Int. Cl.
*H01L 33/32* (2010.01)
*H01L 33/44* (2010.01)
*H01L 33/62* (2010.01)

(56) References Cited

U.S. PATENT DOCUMENTS

| | | |
|---|---|---|
| 2010/0167434 A1 | 7/2010 | Fang et al. |
| 2012/0018765 A1 | 1/2012 | Mizogami et al. |
| 2012/0074441 A1 | 3/2012 | Seo et al. |
| 2013/0277696 A1 | 10/2013 | Matsui et al. |
| 2014/0077220 A1 | 3/2014 | Kryliouk et al. |
| 2015/0028379 A1 | 1/2015 | Chen |
| 2015/0255682 A1 | 9/2015 | Yin et al. |

FOREIGN PATENT DOCUMENTS

| | | |
|---|---|---|
| CN | 102339921 A | 2/2012 |
| CN | 103022306 A | 4/2013 |
| CN | 103094442 A | 5/2013 |
| DE | 10 2012 112 771 A1 | 6/2014 |
| JP | 2003-133590 A | 5/2003 |
| JP | 2008-192710 A | 8/2008 |
| WO | 98/42030 A1 | 9/1998 |
| WO | 2010/024375 A1 | 3/2010 |
| WO | 2015/078919 A1 | 6/2015 |

OTHER PUBLICATIONS

Notice of Reasons for Rejection dated Nov. 20, 2018, issued against corresponding Japanese Patent Application No. 2017-567749, including English translation (18 pages).

First Office Action with Search Report dated Dec. 3, 2018, issued against corresponding Chinese Patent Application No. 201680041209.X (8 pages).

\* cited by examiner

A)

B)

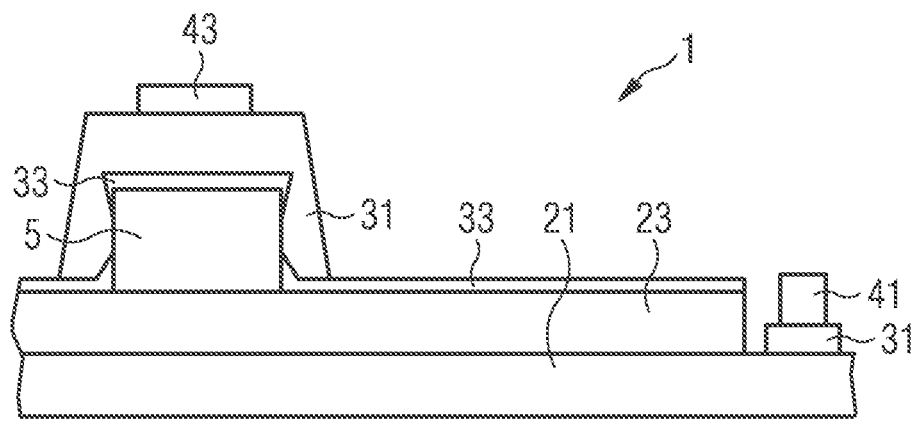
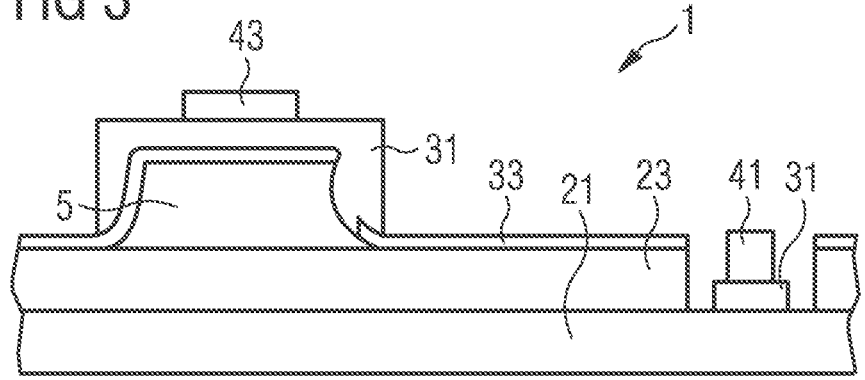
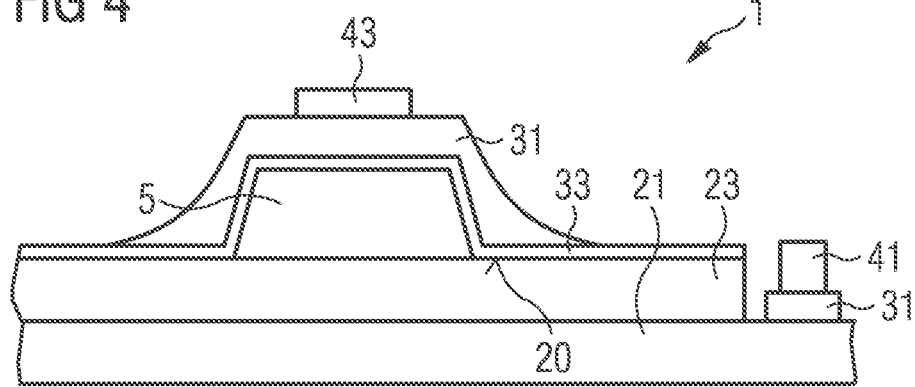

OPTOELECTRONIC SEMICONDUCTOR CHIP

CROSS-REFERENCE OF RELATED APPLICATIONS

This application is the U.S. National Phase under 35 U.S.C. § 371 of International Patent Application No. PCT/EP2016/066659, filed on Jul. 13, 2016, which in turn claims the benefit of German Application No. 10 2015 111 301.5, filed on Jul. 13, 2015, the entire disclosures of which Applications are incorporated by reference herein.

DESCRIPTION

An optoelectronic semiconductor chip is provided.

An object to be achieved is to provide an optoelectronic semiconductor chip having a high external quantum efficiency.

This object is achieved, inter alia, by means of an optoelectronic semiconductor chip having the features of the independent patent claim. Preferred further developments are the subject-matter of the dependent claims.

According to at least one embodiment, the optoelectronic semiconductor chip is a light-emitting diode chip, a laser diode chip or a photodetector. The semiconductor chip is particularly preferably designed as a light-emitting diode chip and for emitting electromagnetic radiation. For example, the semiconductor chip emits with maximum intensity at a wavelength of at least 350 nm or 400 nm and/or of at most 550 nm or 480 nm or 460 nm.

According to at least one embodiment, the optoelectronic semiconductor chip comprises a semiconductor layer sequence. The semiconductor layer sequence is preferably based on a III-V compound semiconductor material. The semiconductor material is for example a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_mAs$, wherein in each case $0 \leq n \leq 1$, $0 \leq m \leq 1$ and $m+n \leq 1$ shall apply. The semiconductor material may in this case additionally comprise a significant quantity of admixed boron and dopants. For simplicity's sake, however, only the essential constituents of the crystal lattice of the semiconductor material are indicated, i.e. B, Al, As, Ga, In, N and/or P, even if these may in part be replaced and/or supplemented by small quantities of other substances.

According to at least one embodiment, the semiconductor layer sequence comprises a first semiconductor region of a first conductivity type and a second semiconductor region of a second, different conductivity type. Conductivity type in this case indicates 'n-conducting' or 'p-conducting'. Preferably, the first semiconductor region is n-doped and the second semiconductor region p-doped.

According to at least one embodiment, between the first semiconductor region and the second semiconductor region there is an active zone. The active zone is preferably designed to generate the radiation emitted by the semiconductor chip during operation. The two semiconductor regions and the intermediate active zone are thus arranged stacked one above the other along a growth direction of the semiconductor layer sequence. The active zone preferably directly adjoins the two semiconductor regions.

According to at least one embodiment, the optoelectronic semiconductor chip comprises a first electrical contact layer. The first electrical contact layer is located directly on the first semiconductor region in places. The electrical contact layer is further configured to serve for injecting current into the first semiconductor region. In particular, the first electrical contact layer is thus adapted to have an electrical contact resistance and electrical work function that corresponds to the first semiconductor region. In particular, current is injected directly into the first semiconductor region exclusively via the first electrical contact layer.

According to at least one embodiment, the semiconductor chip has a second electrical contact layer, which is located in places directly on the second semiconductor region and which is configured to inject current into the second semiconductor region. In particular, current is injected directly into the second semiconductor region exclusively via the second electrical contact layer.

According to at least one embodiment, the semiconductor chip has at least two metallic power supply lines. 'Metallic' means in particular that the power supply lines consist of one or more metals and exhibit an ohmic current conduction characteristic. The power supply lines can be contact metallizations. The power supply lines are preferably located directly on the first electrical contact layer, preferably exclusively on the first electrical contact layer. Preferably, the power supply lines are the exclusive source of current injection into the first and/or second electrical contact layer. In particular, one of the power supply lines is designed as an anode contact and another one of the power supply lines is designed as a cathode contact. An external electrical connection can be made to the optoelectronic semiconductor chip via the power supply lines.

According to at least one embodiment, the semiconductor chip comprises at least one electrically insulating layer. In the intended use of the semiconductor chip, current flow through the electrically insulating layer is suppressed. The insulating layer is located directly on some portions of the second semiconductor region and thus covers the second semiconductor region at those portions.

According to at least one embodiment, the insulating layer protrudes above the second semiconductor region. In other words, the insulating layer is applied to the second semiconductor region without a recess or a depression for the insulating layer being provided in the second semiconductor region. If portions of the second semiconductor region on which the insulating layer is not located are provided with a roughening, for example, in order to improve the light outcoupling efficiency, the insulating layer covers such a roughening.

According to at least one embodiment, the insulating layer is arranged below the current supply line to which the second semiconductor region is electrically connected. In other words, the insulating layer is located between the second semiconductor region and the associated current supply line. In this case, the insulating layer preferably has no direct physical contact with said current supply line. In particular, both a material of the first electrical contact layer and a material of the second electrical contact layer lie between said current supply line and the insulating layer.

According to at least one embodiment, the two contact layers are each produced from one or more transparent conductive oxides, TCO for short. Transparent conductive oxides are generally metal oxides such as, for example, zinc oxide, tin oxide, cadmium oxide, titanium oxide, indium oxide or indium tin oxide (ITO). In addition to binary metal-oxygen compounds, such as $ZnO$, $SnO_2$ or $In_2O_3$, the group of TCOs also includes ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides. Furthermore, the TCOs do not necessarily correspond to a stoichiometric composition and can also be p-doped or n-doped.

According to at least one embodiment, the first contact layer covers the second contact layer in the region of the insulating layer. In this case, the second contact layer preferably lies directly on the insulating layer and the first contact layer lies directly on the second contact layer. Thus, a current injection takes place from the metallic current supply for the second semiconductor region into the first contact layer, from there into the second contact layer and from there, shifted in a lateral direction, into the second semiconductor region.

According to at least one embodiment, the first contact layer covers the insulating layer. In other words, the elevation which is formed by the insulating layer above the second semiconductor region is covered in the manner of a cap or in the manner of a ceiling by the first contact layer. In particular, viewed in a plan view, a material of the first contact layer and preferably also a material of the second contact layer is/are located over the entire insulating layer.

In at least one embodiment, the optoelectronic semiconductor chip comprises a first semiconductor region of a first conductivity type and a second semiconductor region of a second conductivity type. Between these two semiconductor regions there is an active zone, which is preferably designed to generate visible light. A first electrical contact layer is located directly on portions of the first semiconductor region and is configured to inject current into the first semiconductor region. Furthermore, a second electrical contact layer is located directly on portions of the second semiconductor region, wherein the second semiconductor region is supplied with current via the second contact layer. Furthermore, the semiconductor chip contains two metallic power supply lines and an insulating layer. The insulating layer directly covers portions of the second semiconductor region and rises above the second semiconductor region. Furthermore, the insulating layer is located below the current supply line for the second semiconductor region. The two contact layers are each produced from a transparent conductive oxide, and the first contact layer directly covers the second contact layer and the insulating layer in a region of the insulating layer.

Especially light-emitting diode chips, LED chips for short, comprise sapphire growth substrates, and electrical insulating layers. The electrical insulating layers prevent a direct current flow from a metallic power supply line to a semiconductor layer sequence. Such insulating layers prevent light from being generated directly below the metallic power supply lines. If light were generated in this region, this would result in only a small proportion of said light being coupled out of the LED chip. In addition, metallic structures are strong absorbers of light compared to other structures. In order to achieve lateral current spreading, such insulating layers are covered with a transparent conductive layer, wherein such a layer represents a contact layer for the corresponding semiconductor region. However, contact layers made of transparent conductive oxides have a comparatively low light transmittance at a high electrical conductivity and vice versa. In order to reduce radiation absorption, a thin contact layer is advantageous to achieve a high light coupling-out efficiency. However, in the case of thin contact layers, problems occur during the covering by the insulating layer, so that an electrical contact between the contact layer and the metallic power supply line can be interrupted in the region of the insulating layer, which can lead to a low yield in the production of the semiconductor chips.

In the case of the semiconductor chip described here, the second contact layer, which extends laterally across the second semiconductor region, can be selected to be considerably thinner, since the insulating layer is locally covered by the first contact layer. Even if no continuous electrical contact can be achieved by the second contact layer from the power supply line into the second semiconductor region, such electrical contact is ensured by the first contact layer covering the insulating layer.

According to at least one embodiment, the insulating layer prevents a current injection from the current supply line for the second semiconductor region into the second semiconductor region in a direction perpendicular to the second semiconductor region. In other words, current is injected into the second contact layer via said current supply line and the second contact layer spreads the current in a lateral direction across the second semiconductor region. A two-dimensional energization of the second semiconductor region is thus possible. An electrical conductivity in the lateral direction, that is to say in the direction perpendicular to a growth direction of the semiconductor layer sequence, is larger in the second contact layer by at least a factor of 10, or in some embodiments, by a factor of 100, than in the second semiconductor region.

According to at least one embodiment, the first contact layer extends beyond the insulating layer laterally, viewed in a plan view, by at least 200 nm, at least 0.5 µm, at least 1 m, or at least 5 m. Alternatively or additionally, this overhang of the first contact layer over the insulating layer, viewed in a plan view, is at most 100 µm, at most 50 µm, at most 20 µm, or at most 10 m. Furthermore, it is alternatively or additionally possible for this extension of the first contact layer over the insulating layer, once again seen in plan view, to be at least 1%, at least 5%, at least 15%, or at least 20% and/or at most 150%, at most 90%, or at most 60% of a mean width of the insulating layer. As a result of such an extension of the first contact layer over the insulating layer, on the one hand, that a current injection into the second semiconductor region may be ensured and, on the other hand, that absorption losses because of the first contact layer may be kept low.

According to at least one embodiment, the first contact layer, in a cross section view, is wedge-shaped and continuously thins in a direction away from the insulating layer. In other words, a thickness of the first contact layer becomes smaller in a direction away from the insulating layer.

According to at least one embodiment, the width of the insulating layer is at least 5 µm or 20 µm, seen in plan view. Alternatively or additionally, the width of the insulating layer is at most 0.2 mm, at most 0.1 mm, at most 50 µm, or at most 30 µm.

According to at least one embodiment, a thickness of the first contact layer is greater than a thickness of the second contact layer by at least a factor of 2 or 3 or 5. Alternatively or additionally, the thickness of the first contact layer exceeds the thickness of the second contact layer by at most a factor of 20 or 15 or 10.

According to at least one embodiment, the thicknesses of the two contact layers are each smaller than a thickness of the insulating layer. In this case, the thickness of the insulating layer exceeds the thickness of the first contact layer preferably at least by a factor 1.5 or 2 or 3 and/or by at most a factor of 5 or 3.5 or 2.

According to at least one embodiment, the thickness of the first contact layer is at least 30 nm or 50 nm or 100 nm and/or at most 500 nm or 300 nm or 150 nm. It is also possible that the thickness of the second contact layer is at least 5 nm or 10 nm or 15 nm and/or is at most 100 nm or 70 nm or 50 nm or 30 nm. In other words, the second contact layer is comparatively thin.

According to at least one embodiment, the insulating layer has a thickness which is at least 70 nm or 100 nm or 150 nm. Alternatively or additionally, the thickness of the insulating layer is at most 1 µm or 500 nm or 300 nm. In particular, the thickness of the insulating layer is selected so that the thickness exceeds a penetration depth of an evanescent field of light, which is totally reflected on the insulating layer and which is generated in the semiconductor chip during operation. The penetration depth of the light is in this case in particular the depth at which the radiation intensity has fallen to 1/e. The insulating layer can also be designed as a Bragg mirror.

According to at least one embodiment, a material of the first contact layer has a smaller average grain size than a material of the second contact layer. For example, an average grain size of the material of the first contact layer is at least 5 nm or 10 nm and/or at most 50 nm or 20 nm. Moreover, a grain size of the material of the second contact layer can be at least 1 nm or 100 nm or 200 nm or 1 µm and/or at most 2 µm or 1 µm or 0.5 µm or 2 nm.

According to at least one embodiment, the first contact layer and the second contact layer are produced from the same base material. The base material is, for example, zinc oxide or indium tin oxide.

According to at least one embodiment, the two contact layers differ from one another in one or more of the following properties: doping, average grain size, electrical conductivity, electrical contact resistance, surface roughness. For example, the second contact layer has a greater surface roughness than the first contact layer.

According to at least one embodiment, both contact layers are made of indium tin oxide. In this case, a tin content is preferably at least 3% or 5% and/or at most 10% or 8%. In this case, the first contact layer preferably has a higher proportion of tin than the second contact layer, for example a tin content increased by at least 0.5 percentage points or by at least 1 percentage point. The tin contents in this case relate, in particular, to mass percent.

According to at least one embodiment, the insulating layer is composed of an electrically insulating oxide, nitride or oxynitride. In particular, the insulating layer is produced of silicon dioxide or aluminum nitride. A material of the insulating layer is preferably permeable to the radiation generated in the semiconductor chip during operation.

According to at least one embodiment, the two contact layers are produced of different materials. For example, one of the contact layers comprises indium tin oxide, ITO for short, and the other contact layer comprises zinc oxide.

According to at least one embodiment, viewed in a cross section, the insulating layer becomes narrower away from the second semiconductor region, at least up to a mean thickness of the insulating layer. The insulating layer is preferably free of undercuts. The term undercut can mean that, when viewed from above, not the entire side surfaces of the insulating layer can be seen. Alternatively, it is possible that the insulating layer has such an undercut, for example due to a method for producing the insulation layer.

According to at least one embodiment, the first contact layer covers at most 20% or 10% or 5% of the two semiconductor regions, viewed in plan view. Alternatively or additionally, this degree of coverage is at least 0.5% or 1% or 2%. In other words, the semiconductor layer sequence is substantially free of the first contact layer when seen in a plan view, with the exception of a contact region for the first semiconductor region.

According to at least one embodiment, the second contact layer covers at least 90% or 95% or even all of the second semiconductor region, viewed in a plan view. This ensures efficient current spreading in the lateral direction by the second contact layer. In this case, it is possible for edges of the second semiconductor region to be free of the second contact layer and also free of the first contact layer. As a result, it is possible for the second semiconductor region to be prevented from being energized close to such edges. For example, the edges are free of the second contact layer in a strip having a width of at least 1 µm or 2 µm and/or of at most 5 µm or 3 µm.

According to at least one embodiment, the semiconductor chip has an n-contact region, in which the first contact layer touches the first semiconductor region and in which current is injected into the first semiconductor region. The n-contact region is surrounded on all sides by the second semiconductor region when viewed in plan view. In other words, the n-contact region is located in a recess of the second semiconductor region. Alternatively, it is possible for the n-contact region to be located at an edge of the semiconductor layer sequence when seen in a plan view. It is also possible for more than one n-contact regions to be present.

According to at least one embodiment, the current supply line for the second semiconductor region forms a current spreading structure. For example, the current supply line for the second semiconductor region is structured in the form of webs which extend over the semiconductor layer sequence. In this case, preferably at most 10% or 5% and/or at least 2% or 4% of the semiconductor layer sequence are covered by the current supply line, seen in plan view.

According to at least one embodiment, in the region of the insulating layer and in a direction perpendicular to the second semiconductor region, the following components follow in the specified order directly one on top of the other: first semiconductor region, active zone, second semiconductor region, insulating layer, second contact layer, first contact layer, metallic current supply line for the second semiconductor region.

According to at least one embodiment, the semiconductor chip has the following components in an electrical contact region for the first semiconductor region, which immediately succeed one another in a direction perpendicular to the first semiconductor region in the specified sequence: first semiconductor region, first contact layer, metallic current supply for the first semiconductor region.

An optoelectronic semiconductor chip described here is explained in more detail below with reference to the drawing on the basis of exemplary embodiments. Identical reference numerals indicate the same elements in the individual figures. In this case, however, no relationships to scale are illustrated; rather, individual elements can be represented with an exaggerated size in order to afford a better understanding.

In the figures:

FIGS. 1A, 2, 3 and 4 show schematic sectional representations of exemplary embodiments of optoelectronic semiconductor chips described here, and FIG. 1B shows a schematic plan view of an exemplary embodiment of an optoelectronic semiconductor chip described here.

An exemplary embodiment of an optoelectronic semiconductor chip 1 is schematically shown in a sectional illustration in FIG. 1A and in a plan view in FIG. 1B.

A semiconductor layer sequence 2 is applied on a carrier 6, which can be a growth substrate. The semiconductor layer sequence 2 comprises an n-doped first semiconductor region 21 and a p-doped second semiconductor region 23. An active zone 22 for generating light, in particular blue light, is located between the semiconductor regions 21 and 23. The semiconductor layer sequence 2 is based on the material system AlInGaN. A thickness of the semiconductor layer sequence 2 is approximately 8 µm, for example.

The semiconductor layer sequence 2 is electrically contacted externally via metallic, electrical current supply lines 41, 43. The current supply lines 41, 43 preferably comprise a plurality of metals and are in particular multi-layer systems of aluminum, gold, platinum, titanium, ruthenium and/or tungsten. The n-doped first semiconductor region is supplied with current via the first current supply 41 and the second p-doped semiconductor region 23 is supplied with current via the second current supply 43.

An electrical insulating layer 5, in particular made of silicon dioxide, is located on the second semiconductor region 23. The insulating layer 5 is located between the second semiconductor region 23 and the second current supply 43. The insulating layer 5 prevents the generation of radiation below the second current supply 43 in the active zone 22, seen in plan view.

Seen in a cross-sectional view, the insulating layer 5 is formed symmetrically, with respect to an axis perpendicular to the active zone 22. According to FIG. 1A, the insulating layer 5 has a trapezoidal shape and tapers in the direction away from the second semiconductor region 23. A width B of the insulating layer 5 directly on the second semiconductor region 23 is, for example, approximately 20 µm and a thickness D5 of the insulating layer 5 is, for example, approximately 250 nm. The insulating layer 5 is made of a light-transmissive material and preferably has an absorption coefficient for the radiation generated in the semiconductor layer sequence 2 of at most 400/cm or 120/cm. For example, at most 0.3% or 1% of the radiation is absorbed by the insulating layer.

Lateral current expansion via the second semiconductor region 23 is achieved by a second contact layer 33, which is applied laterally across the second semiconductor region 23. Radiation generated in the semiconductor layer sequence 2 at least partially passes through the second contact layer 33 out of the semiconductor chip 1. The second contact layer 33 is made in particular of ITO.

In order to achieve a high transparency of the second contact layer 33 and in order to achieve a high out-coupling efficiency of radiation from the semiconductor chip 1, the second contact layer 33 has only a small thickness D3 at a radiation output side 20 of the semiconductor layer sequence 2. The thickness D3 is preferably approximately 15 nm to 60 nm, for example, approximately 20 nm. Due to the small thickness of the second contact layer 33, it is problematic to cover the insulating layer 5, which extends over the second semiconductor region 23, without fractures or cracks arising in the second contact layer 33. Such cracks could endanger an electrical connection from the current supply line 43 into the second semiconductor region 23 if only the second contact layer 33 is present.

In order to establish an electrical connection between the second semiconductor region 23 and the second current supply 43, the insulating layer 5 is additionally covered by a first contact layer 31. The first contact layer 31 is a contact layer which is provided for an n-contact towards the first semiconductor region 21. At an n-contact region which is located in a recess of the second semiconductor region 23, the first contact layer 31 is applied locally, directly to the first semiconductor region 21. The first contact layer 31 is directly followed by the first current supply line 41 in this n-contact region.

A thickness D1 of the first contact layer 31 preferably exceeds the thickness D3 of the second contact layer 33 by at least a factor of 3. In particular, the thickness D1 of the first contact layer 31 is approximately 100 nm to 150 nm. The first contact layer 31 completely covers the insulating layer 5 and laterally extends in places beyond the sides of the insulating layer 5, seen in plan view. It is thus ensured that a reliable electrical connection between the second current supply 43 and the second contact layer 33 on the radiation output side 20 is provided.

In a direction away from the insulating layer 5, the first contact layer 31 continuously tapers off on the radiation output side 20. In other words, the first contact layer 31 has a triangular cross-section in regions which, viewed in plan view, are located adjacent to the insulating layer 5, wherein a largest width is realized close to the insulating layer 5. No current injection takes place directly from the first contact layer 31 into the second semiconductor region 23, but only into the second contact layer 33.

In the n-contact region, the first contact layer 31 is preferably located completely in a recess in the second semiconductor region 23. Said recess has a rectangular base surface, for example, when seen in plan view. In an alternative to the implementation shown in FIG. 1B, said recess can also be shifted to an edge of the semiconductor layer sequence 2, when seen in plan view. In an alternative to the implementation shown in FIG. 1B, the base surface can also be round or oval or hexagonal. The first current supply line 41 preferably projects beyond said recess in the second semiconductor region 23. In a region in which vertically and horizontally running lines of the second current supply 43 abut in FIG. 1B, the second current supply 43 can have a widening in which, for example, a bonding wire, not shown, can be attached.

The second current supply 43 is preferably surrounded on all sides by material of the first contact layer 31, when seen in plan view. There is no direct electrical connection between the first contact layer 31 on the insulating layer 5 and the first contact layer 31 on the n-contact region, but there is only an indirect electrical connection through the active zone 22.

In the semiconductor chip 1, as illustrated in FIG. 1, the second contact layer 33 is preferably applied first, and the first contact layer 31 is only subsequently applied. When the first contact layer 31 is applied, a mask is formed in a corresponding manner, so that the first contact layer 31 is applied in an adequately structured manner. A flank angle of the first contact layer 31 at the insulating layer 5 can be adjusted, for example, by means of photomasks with undercuts, wherein the contact layers 31, 33 are then preferably applied by means of sputtering. Such masks with undercuts are known, for example, from the publication WO 2011/078919 A1, the disclosure content of which with regard to the mask shape and the application of materials with the aid of such masks is incorporated by reference.

The two contact layers 31, 33 are, for example, both formed from ITO. However, the two contact layers 31, 33 are preferably applied with different process parameters, so that the first contact layer 31 is produced as an n-contact and the second contact layer 33 is produced as a p-contact.

FIG. 2 shows a further exemplary embodiment of the semiconductor chip 1. In contrast to FIG. 1, the insulating layer 5 has an approximately rectangular cross section. As a result, it is possible that side surfaces of the insulating layer 5 are only partially covered with the relatively thin second contact layer 33. An electrical connection via the side surfaces of the insulating layer 5 is achieved by the first contact layer 31, which is approximately trapezoidal when viewed in cross section.

As in all other exemplary embodiments, it is also possible that the insulating layer 5 has a greater width than the second current supply 43. Thus, the current supply 43, viewed in plan view, is surrounded by the insulating layer 5.

In the case of the exemplary embodiment of the semiconductor chip 1 as shown in FIG. 3, the insulating layer 5 has an undercut when viewed in a cross section. In other words, in the region of the undercut, a material of the insulating layer 5 covers another section of the side surface of the insulating layer 5, seen in plan view. Correspondingly, since the second contact layer 33 is thin, the material of the second contact layer 33 cannot be deposited on the insulating layer 5 in the region of the undercut. The undercut region is covered by the significantly thicker first contact layer 31. For example, the first contact layer 31 has an approximately rectangular contour in the region of the insulating layer. As a result, the second contact layer 33 only slightly projects beyond the insulating layer 5.

In the case of the exemplary embodiment as illustrated in conjunction with FIG. 4, at the insulating layer 5, the first contact layer 31 has comparatively large tails which extend relatively far onto the radiation exit output side 20. As a result, a comparatively gentle transition from the first contact layer 31 to the second contact layer 33 can be realized. The tail of the first contact layer 31 beyond the insulating layer 5, when viewed from above, amounts to approximately 50% of a width of the insulating layer 5. The second contact layer 33 runs on both sides of the insulating layer 5 approximately symmetrically and in the same manner. Such tails from the first contact layer 31 can also be present in all other exemplary embodiments.

In FIGS. 1 to 4, the insulating layer 5 is represented in each case as a single layer. In the alternative, it is in each case possible for the insulating layer 5 to be composed of a plurality of partial layers. For example, the insulating layer 5 can have a Bragg mirror for improved reflection of radiation. The contact layers 31, 33 are preferably formed only as a single layer. However, it is optionally possible to deviate from the implementation, so that one of or both contact layers 31, 33 are composed of a plurality of partial layers.

The invention described here is not restricted by the description on the basis of the exemplary embodiments. Rather, the invention encompasses any novel feature and any combination of features, which in particular includes any combination of features in the patent claims, even if this feature or this combination itself is not explicitly specified in the patent claims or exemplary embodiments.

This patent application claims the priority of German patent application 10 2015 111 301.5, the disclosure content of which is hereby incorporated by reference.

LIST OF REFERENCE NUMERALS

1 Optoelectronic semiconductor chip
2 Semiconductor layer sequence
20 Radiation output side
21 First, n-doped semiconductor region
22 Active zone
23 Second, p-doped semiconductor region
31 First electrical contact layer made of a TCO
33 Second electrical contact layer made of a TCO
41 Current supply for the n-doped semiconductor region
43 Current supply for the p-doped semiconductor region
5 Insulating layer
6 Carrier
B width of the insulating layer
D1 thickness of the first contact layer
D3 thickness of the second contact layer
D5 thickness of the insulating layer

The invention claimed is:

1. An optoelectronic semiconductor chip comprising:
a first semiconductor region of a first conductivity type and a second semiconductor region of a second conductivity type, an active zone disposed between the first semiconductor region and the second semiconductor region,
a first metallic current supply line for the first semiconductor region and a second metallic current supply line for the second semiconductor region,
a first electrical contact layer which includes a first portion of the first electrical contact layer that is in direct contact with a first portion of the first semiconductor region and is configured for injecting current received from the first metallic current supply line into the first semiconductor region,
a second electrical contact layer which is in direct contact with a first portion of the second semiconductor region and is configured for injecting current received from the second metallic current supply line through a second portion of the first electrical contact layer into the second semiconductor region,
an insulating layer which is in direct contact with a second portion of the second semiconductor region, wherein the insulating layer is disposed between the second semiconductor region and the second metallic current supply line, wherein
the first electrical contact layer and the second electrical contact layer comprise a transparent conductive oxide,
the second portion of the first electrical contact layer directly covers the second electrical contact layer in a region surrounding the insulating layer such that the first electrical contact layer and the second electrical contact layer cover the insulating layer, and
a thickness of the first electrical contact layer exceeds a thickness of the second electrical contact layer by a factor of between 3 and 20 inclusive.

2. The optoelectronic semiconductor chip according to claim 1,
wherein the insulating layer prevents a current injection from the second metallic current supply line to the second portion of the second semiconductor region in a direction perpendicular to the second semiconductor region,
wherein the second electrical contact layer conducts current laterally from the second metallic current supply line, and
wherein the first electrical contact layer extends laterally beyond the insulating layer by at least 200 nm and up to 90% of a width of the insulating layer.

3. The optoelectronic semiconductor chip according to claim 2,
wherein the first electrical contact layer becomes continuously thinner and tapers in a wedge-shaped manner in a direction away from the insulating layer, wherein the first electrical contact layer extends laterally beyond the insulating layer by at least 15% of the width, and wherein the width is between 5 μm and 100 μm inclusive.

4. The optoelectronic semiconductor chip according to claim 1, wherein the thicknesses of the first and second electrical contact layers are smaller than a thickness of the insulating layer.

5. The optoelectronic semiconductor chip according to claim 1, wherein the thickness of the first electrical contact layer is between 50 nm and 500 nm inclusive and the thickness of the second electrical contact layer is between 5 nm and 70 nm inclusive, and wherein the thickness of the insulating layer is between 100 nm and 1 μm inclusive.

6. The optoelectronic semiconductor chip according to claim 1, wherein a material of the first electrical contact layer has a smaller average grain size than a material of the second electrical contact layer.

7. The optoelectronic semiconductor chip according to claim 1, wherein the first and second electrical contact layers comprise a same base material, but are different in at least one of the following properties: doping, mean particle size, electrical conductivity, electrical contact resistance, and surface roughness.

8. The optoelectronic semiconductor chip according to claim 7, wherein the first and second electrical contact layers comprise indium tin oxide with a tin content of between 3% and 10% inclusive, wherein the insulating layer comprises silicon dioxide, and the first and second semiconductor regions and the active zone comprise an AlInGaN material system.

9. The optoelectronic semiconductor chip according to claim 1, wherein the first and second electrical contact layers comprise different materials.

10. The optoelectronic semiconductor chip according to claim 1, wherein the insulating layer has a continuously narrower width in a direction away from the second semiconductor region at least up to a mean thickness of the insulating layer and is free of undercuts.

11. The optoelectronic semiconductor chip according to claim 1, wherein at most 20% of the first and second semiconductor regions is covered by the first electrical contact layer and wherein at least 90% of the second semiconductor region is covered by the second electrical contact layer.

12. The optoelectronic semiconductor chip according to claim 1, wherein the first electrical contact layer directly adjoins the first semiconductor region and the first metallic current supply line in an n-contact region, the first semiconductor region being n-doped, and wherein the first electrical contact layer is not connected to the n-contact region at the insulating layer.

13. The optoelectronic semiconductor chip according to claim 12, wherein the n-contact region is surrounded on all sides by the second semiconductor region, which is p-doped, so that the n-contact region is located in a recess of the second semiconductor region.

14. The optoelectronic semiconductor chip according to claim 1, wherein, in the region of the insulating layer, the following components directly succeed one another in a direction perpendicular to the second semiconductor region in the specified sequence: the first semiconductor region, the active zone, the second semiconductor region, the insulating layer, the second electrical contact layer, the first electrical contact layer, the second metallic current supply line for the second semiconductor region, and wherein, in an electrical contact region for the first semiconductor region, the following components directly succeed one another in a direction perpendicular to the first semiconductor region in the specified order: the first semiconductor region, the first electrical contact layer, the first metallic current supply line for the first semiconductor region.

* * * * *